(12) United States Patent
Li et al.

(10) Patent No.: US 12,274,185 B2
(45) Date of Patent: Apr. 8, 2025

(54) PHASE CHANGE MEMORY CELL HAVING PILLAR BOTTOM ELECTRODE WITH IMPROVED THERMAL INSULATION

(71) Applicant: International Business Machines Corporation, Armonk, NY (US)

(72) Inventors: Juntao Li, Cohoes, NY (US); Ruilong Xie, Niskayuna, NY (US); Kangguo Cheng, Schenectady, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 478 days.

(21) Appl. No.: 17/505,067

(22) Filed: Oct. 19, 2021

(65) Prior Publication Data

US 2023/0122498 A1    Apr. 20, 2023

(51) Int. Cl.
*G11C 16/04*    (2006.01)
*H10B 63/00*    (2023.01)
*H10N 70/00*    (2023.01)
*H10N 70/20*    (2023.01)

(52) U.S. Cl.
CPC ........... *H10N 70/231* (2023.02); *H10B 63/00* (2023.02); *H10N 70/063* (2023.02); *H10N 70/841* (2023.02); *H10N 70/8613* (2023.02); *H10N 70/8616* (2023.02); *H10N 70/883* (2023.02)

(58) Field of Classification Search
CPC .. H10N 70/231; H10N 70/063; H10N 70/841; H10N 70/8613; H10N 70/8616; H10N 70/883; H10N 70/011; H10N 70/061; H10N 70/826; H10N 63/00; H10B 63/00
See application file for complete search history.

(56) References Cited

U.S. PATENT DOCUMENTS

| | | | |
|---|---|---|---|
| 7,351,992 B2 | 4/2008 | Scheuerlein |
| 7,417,245 B2 | 8/2008 | Happ |
| 7,420,199 B2 | 9/2008 | Gutsche |
| 7,545,668 B2 | 6/2009 | Philipp |
| 7,749,801 B2 | 7/2010 | Choi |
| 7,829,876 B2 | 11/2010 | Lung |

(Continued)

FOREIGN PATENT DOCUMENTS

| | | |
|---|---|---|
| CN | 101226990 A | 7/2008 |
| CN | 101572290 B | 9/2010 |

(Continued)

OTHER PUBLICATIONS

J. Y. Wu, et al. "A low power phase change memory using thermally confined TaN/TiN bottom electrode," 2011 International Electron Devices Meeting, Dec. 2011, pp. 1-4.

(Continued)

*Primary Examiner* — Pho M Luu
(74) *Attorney, Agent, or Firm* — Yuanmin Cai; Otterstedt & Kammer PLLC

(57) ABSTRACT

A phase-change memory device includes a bottom electrode; a stack of alternating electrical conductor layers directly contacting a top surface of the bottom electrode; a metal pillar directly contacting a top surface of the stack; a phase change material element directly contacting a top surface of the metal pillar; and a top electrode on the phase change material element, wherein a lateral dimension of the metal pillar is smaller than that of the stack.

13 Claims, 10 Drawing Sheets

(56) References Cited

U.S. PATENT DOCUMENTS

| | | |
|---|---|---|
| 7,956,358 B2 | 6/2011 | Chen |
| 8,268,665 B2 | 9/2012 | Hunks |
| 9,082,954 B2 | 7/2015 | Lung |
| 9,178,138 B2 | 11/2015 | Tan |
| 10,833,267 B2 | 11/2020 | Ok |
| 10,886,464 B2 | 1/2021 | BrightSky |
| 10,892,413 B2 | 1/2021 | Bruce |
| 11,038,106 B1 | 6/2021 | Radens |
| 2007/0096071 A1 | 5/2007 | Kordus |
| 2010/0019215 A1* | 1/2010 | Lung ............... H10B 63/20 257/E47.001 |
| 2017/0092694 A1* | 3/2017 | BrightSky ......... G11C 13/0069 |
| 2020/0321394 A1* | 10/2020 | Hashemi ............. H10B 61/10 |
| 2020/0395537 A1 | 12/2020 | Ok |
| 2021/0135104 A1 | 5/2021 | Ok |
| 2021/0296580 A1 | 9/2021 | Shen |
| 2021/0305503 A1 | 9/2021 | Philip |
| 2021/0050518 A1 | 10/2021 | Gong |
| 2022/0285617 A1* | 9/2022 | Lee .................. G11C 13/0004 |
| 2023/0081603 A1 | 3/2023 | Wu et al. |
| 2023/0397510 A1* | 12/2023 | Li ....................... H10B 63/80 |

FOREIGN PATENT DOCUMENTS

| | | |
|---|---|---|
| CN | 101820048 A | 9/2010 |
| CN | 101794862 B | 1/2012 |
| CN | 112687359 A | 4/2021 |

OTHER PUBLICATIONS

Ke Wang et al., Achieving Multiple Resistance States in Phase-Change Memory Cell. Japanese Journal of Applied Physics 48 (2009) 074501, pp. 4.

Jensen, Pernille, European Patent Office, PCT/E P2022/077539 on Feb. 7, 2023. International Search Report and the Written Opinion. pp. 11.

Wu JY, Breitwisch M, Kim S, Hsu TH, Cheek R, Du PY, Li J, Lai EK, Zhu Y, Wang TY, Cheng HY. A low power phase change memory using thermally confined TaN/TiN bottom electrode. In 2011 International Electron Devices Meeting Dec. 5, 2011 (pp. 3-2). IEEE. 4 pages total.

Paul J. Otterstedt, List of IBM Patents or Patent Applications Treated as Related, 2 pages Jul. 11, 2024.

* cited by examiner

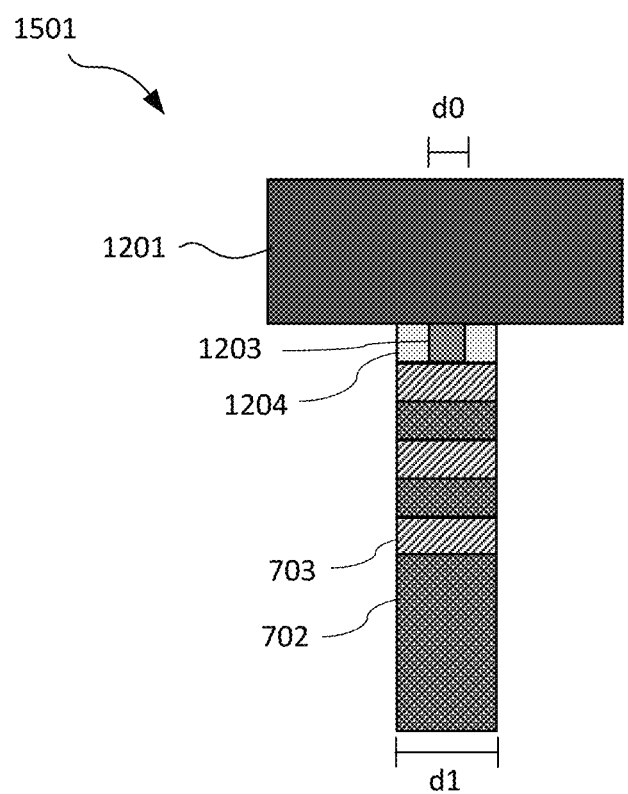

PHASE CHANGE MEMORY CELL HAVING PILLAR BOTTOM ELECTRODE WITH IMPROVED THERMAL INSULATION

BACKGROUND

The present disclosure relates generally to Phase Change Memory (PCM) cells.

PCM is an emerging non-volatile (NV) random-access (RAM) which offers some advantage over existing non-volatile memories (NVMs). It has potentials for both classic memory applications and neuromorphic computing.

One of the major considerations of PCM devices is their programming current, which can be very large during the power-intensive reset step. Reducing the contact area between the heater element and phase change element can help reduce the SET/RESET current.

In addition, most of the heat is generated at the interface between the patterned contact and the phase-change layer due to current confinement. Most of the heat generated inside the cell ends up heating up the nearby dielectric and metal electrodes. Thermal energy is usually lost through the bottom electrode as this is the most thermally conductive path from the interface.

Thus, new bottom electrode integration approach is needed to reduce the programing current as well as heat loss inside the PCM devices.

BRIEF SUMMARY

According to embodiments of the present invention, a phase-change memory device includes a bottom electrode; a stack of alternating electrical conductor layers directly contacting a top surface of the bottom electrode; a metal pillar directly contacting a top surface of the stack; a phase change material element directly contacting a top surface of the metal pillar; and a top electrode on the phase change material element, wherein a lateral dimension of the metal pillar is smaller than that of the stack.

According to embodiments of the present invention, a method for manufacturing a crossbar phase-change memory cell includes: providing a bottom electrode disposed an underlayer; forming a multilayer stack comprising a plurality of alternating electrical conductor layers; depositing a topmost metal layer on the multilayer stack, which is formed of a material different than those of the multilayer stack; forming a hardmask pillar on the topmost metal layer; etching the topmost metal layer to form a metal pillar; forming an inner spacer surrounding the metal pillar; patterning the multilayer stack using the hardmask pillar; forming a dielectric layer having a height equal to a top surface of the metal pillar; removing the hardmask pillar; and forming a phase change material element on the metal pillar.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

- a metal pillar having a small width reducing a programming current needed to effect a phase change;
- a lateral dimension of a metal pillar smaller than a lithographic capability configured to achieve a low programming current;
- an inner spacer surrounding a metal pillar reducing a lateral heat loss of the metal nano pillar; and
- a stack of alternating electrical conductor layers below a metal pillar reducing a downwards heat loss.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings:

FIG. 15 is a view of a PCM cell stack according to one or more embodiments of the present invention.

DETAILED DESCRIPTION

Figure 1:
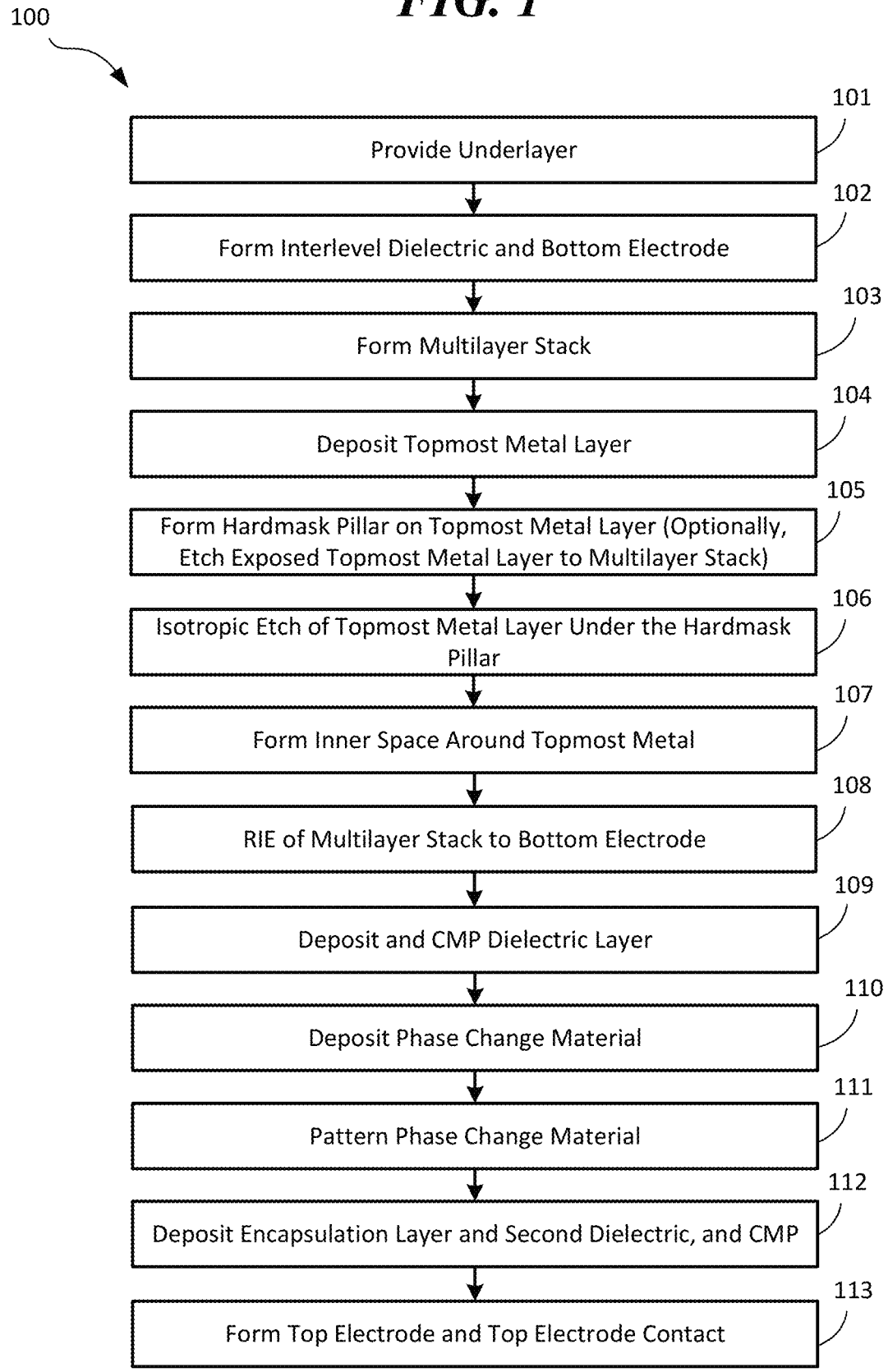
FIG. 1 is method of forming a PCM cell according to one or more embodiments of the present invention.

According to embodiments of the present invention, a method and structure for forming Phase Change Memory (PCM) cell with a metal pillar/heater on multi-layer metal electrode (i.e., a pillar bottom electrode). According to some embodiments, a width dimension of the metal pillar is less than a current lithography limit. According to some aspects, a metal pillar with a width dimension less than a lithography limit is a metal nano pillar. According to some embodiments, a self-aligned inner spacer surrounds the metal nano pillar/heater, wherein the self-aligned inner spacer is a thermal and electrical insulator.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 12:
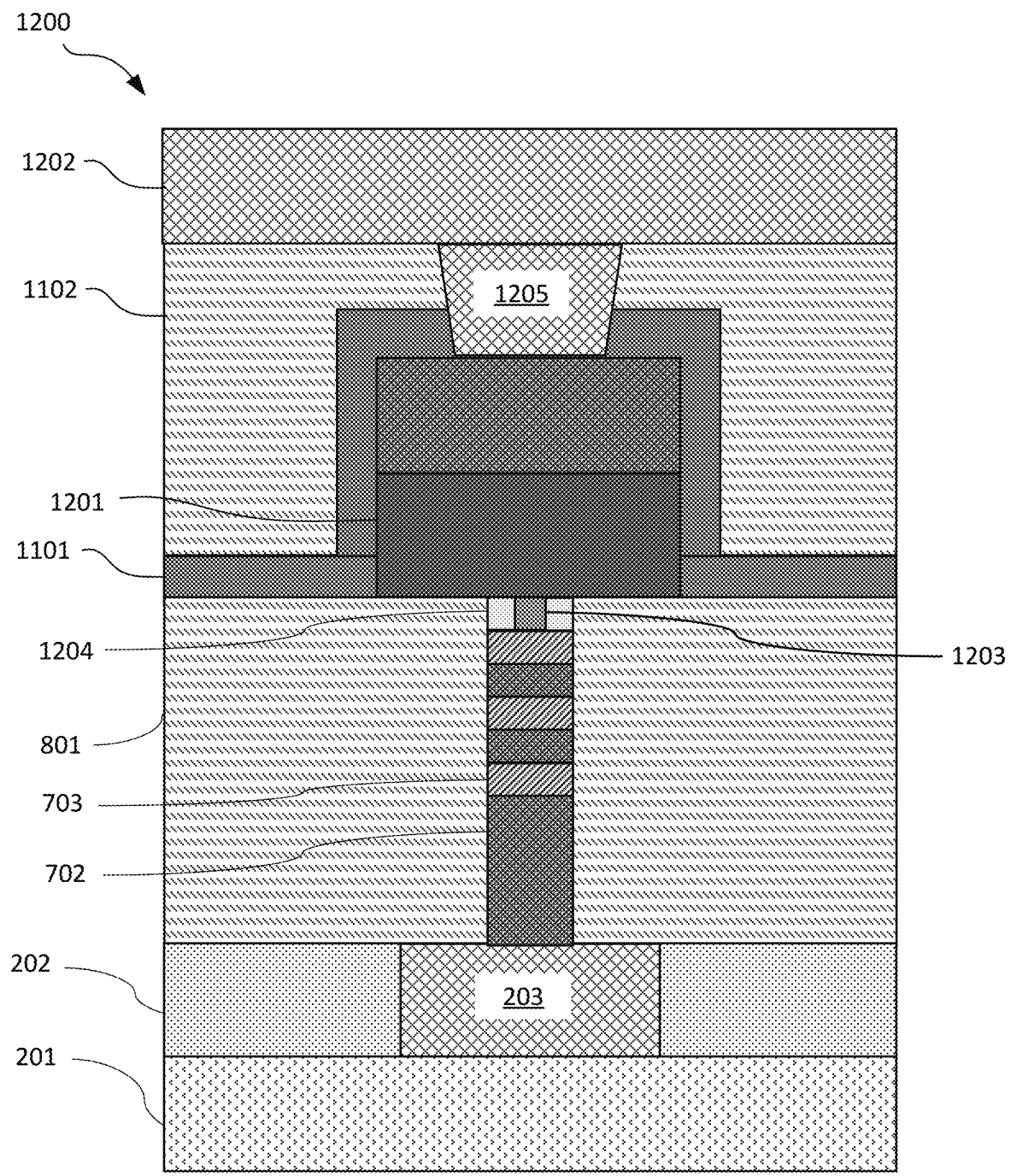

Referring to FIG. 12, according to some aspects, in a crossbar Phase Change Material (PCM) array with top electrodes and bottom electrodes, each PCM cell 1200 has a mushroom PCM element 1201 connected to a top electrode 1202 and a metal nano pillar 1203 with a small dimension (e.g., less than a lithography limit). According to some embodiments, the metal nano pillar 1203 is a heater. The small contact area of the metal nano pillar with the mushroom PCM element reduces a total heat needed for a phase change, which in turn reduces a current needed for each SET or RESET operation. According to some aspects, an inner spacer 1204 surrounding the metal nano pillar can act as a thermal insulation layer to prevent the migration of heat away from a contact region to surrounding material.

FIG. 1 shows a method 100 for manufacturing a crossbar PCM array with top electrodes and bottom electrodes according to one or more embodiments of the present invention.

According to some embodiments of the present invention and referring to FIG. 1, a method 100 for forming Phase Change Memory (PCM) cell with a bottom electrode (pillar type) on multi-layer metal electrode includes providing an underlayer at step 101, and forming an interlevel dielectric (ILD) disposed on the underlayer, and a bottom electrode disposed in the ILD and on the underlayer at step 102. It should be understood that the underlayer can comprise a semiconductor substrate, which itself may include other devices, such as transistors, isolation structures, contacts, etc.

According to some embodiments, the electrodes (e.g., a top electrode and the bottom electrode) of the PCM cell can be formed of TiN, TaN, tungsten (W), aluminum (Al), Ti, Ta, titanium silicon nitride (TiSiN), titanium silicon nitride (TiSiN), titanium aluminum nitride (TiAlN), titanium aluminum nitride (TiAlN), tungsten nitride (WN), and other suitable metals.

According to some embodiments, a multilayer stack is formed at step 103. The multilayer stack can comprise a titanium nitride (TiN)/tantalum nitride (TaN) multilayer stack. According to some embodiments, the first TiN layer can have a thickness greater than any of the other multilayers.

According to some aspects, at step 104 a topmost metal layer is deposited, which is different from the TiN or the TaN layers. Optionally, a bottommost TiN layer can have the same thickness as the following TiN layer.

According to example embodiments, at step 105 a hardmask pillar can be formed on the topmost metal layer. According to some embodiments, the topmost metal layer can be selectively etched using the hardmask pillar as a mask.

According to some embodiments, at step 106 an isotropic (lateral) etch of the topmost metal layer is performed, removing end portions of the topmost metal layer and forming a metal nano pillar under the hardmask pillar. According to some embodiments, the isotropic etch process can be selective to TaN and TiN, so that the multilayer stack is not damaged.

According to example embodiments, a dimension of the metal nano pillar can be beyond (i.e., less than) a dimension that can be formed by lithography, resulting in a reduced contact area with a top phase change material and reducing a total heat required for phase changes, which in turn can reduce a current required for each SET or RESET operations.

According to some embodiments, at step 107 a dielectric liner is deposited and etched back, using the hardmask pillar as a mask, to form an inner spacer.

According to some embodiments, at step 108 a directional Reactive Ion Etch (RIE) of the multilayer stack is performed, which stops on the bottom electrode.

According to some embodiments, at step 109 a dielectric layer (e.g., oxide) is deposited, and a chemical mechanic polish (CMP) is performed, which stops on a top of the metal nano pillar.

According to some embodiments, at step 110 a phase change material, such as $Ge_2Se_2Te_5$ (GST), is deposited.

According to some embodiments, at step 111 a TiN hardmask is formed and used to pattern the phase change material.

According to some embodiments, at step 112 an encapsulation layer, such as SiN, is deposited, a second dielectric layer is deposited, and a CMP is performed.

According to some embodiments, at step 113 a via is formed in the encapsulation layer and second dielectric layer, exposing the hardmask, and a metallization forms a top electrode and top electrode contact. A width dimension of the metal pillar can be less than a lithography capability/limit, resulting in a reduced contact area with top phase change material, which reduces a programming current.

FIGS. 2-12 are cross-section views of a PCM at different steps in a manufacturing process of FIG. 1 according to one or more embodiments of the present invention.

Figure 2:
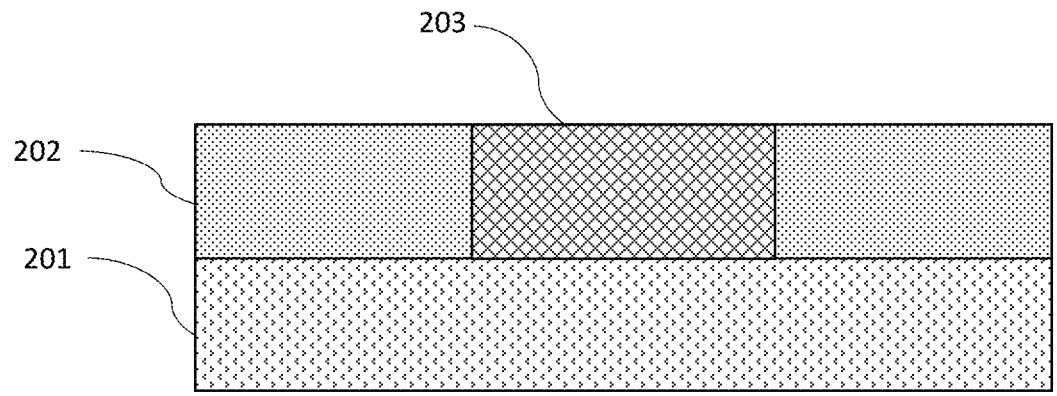
FIGS. 2-12 are cross-section views of a PCM at different steps in a manufacturing process according to one or more embodiments of the present invention.

According to some embodiments of the present invention and referring to FIG. 2, an underlayer 201 is provided. The underlayer 201 can comprise a semiconductor substrate, which itself may include other devices, such as transistors, isolation structures, contacts, etc. According to some embodiments, an ILD 202 is deposited on the underlayer 201 and a bottom electrode 203 is disposed on the underlayer 201 and in the ILD 202. For example, the ILD 202 can be patterned to form openings therein exposing the underlayer 201, and a metallization can deposit a metal material. An overburden of the metal material can be removed by a CMP to form the bottom electrode 203.

According to some embodiments, the bottom electrode 203 can be formed of TiN, TaN, W, Al, Ti, Ta, TiSiN, TiSiN, TiAlN, TiAlN, WN, and other suitable metals.

Figure 3:
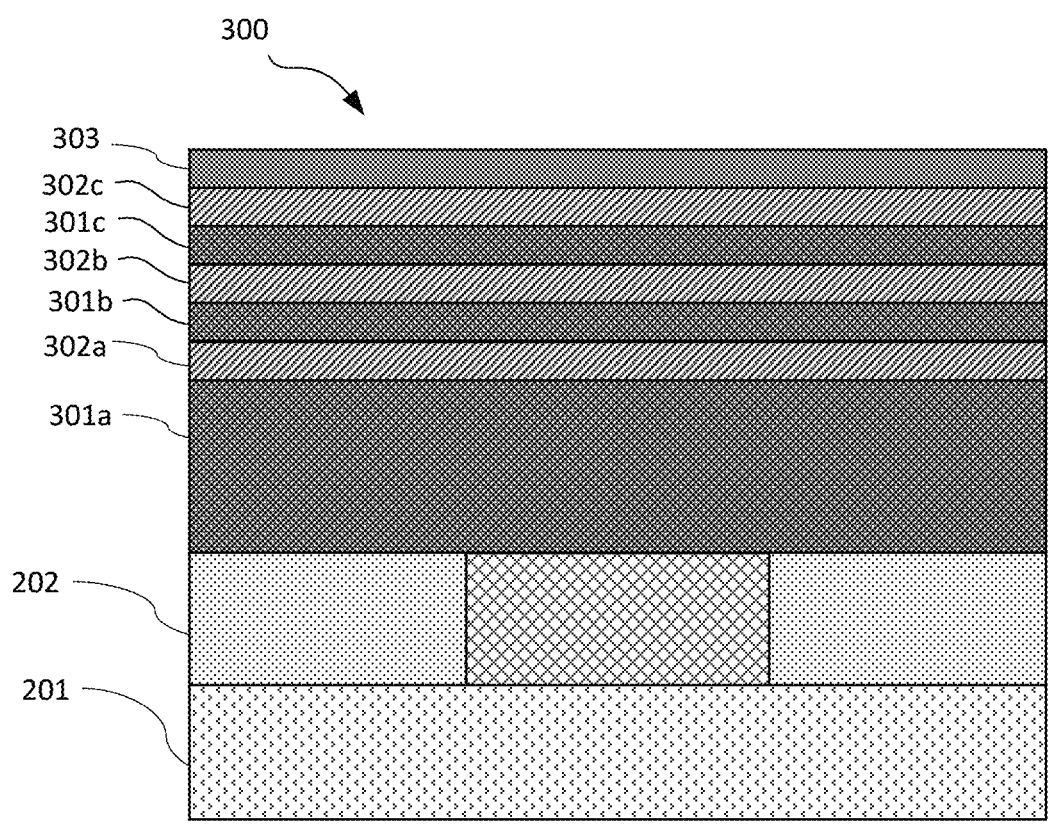

According to some embodiments and referring to FIG. 3, a multilayer stack 300 can comprise alternating layers of TiN 301a, 301b, 301c and TaN 302a, 302b, 302c. According to some embodiments, a bottommost TiN layer 301a of the multilayer stack 300 can have a thickness greater than the combined thickness of the remaining layers of TiN and TaN. According to some aspects, the bottommost TiN layer 301a can have a same thickness as the other TiN layers in the multilayer stack 300. It should be understand that any number of layers can be formed. According to some aspects, a topmost metal layer 303 is deposited, which is formed of a material different than the TiN or the TaN layers.

Figure 4:
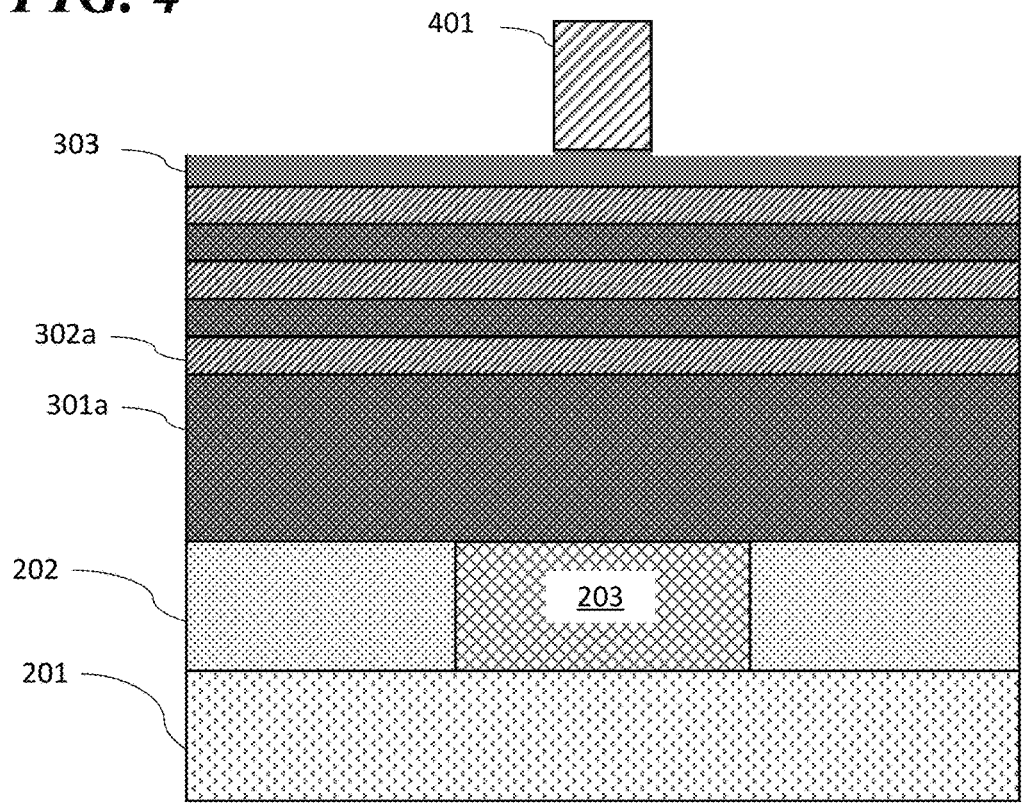

According to some embodiments and referring to FIG. 4, a hardmask pillar 401 can be formed on the topmost metal layer 303. According to some embodiments, the topmost metal layer 303 can be selectively etched to the hardmask pillar 401.

Figure 5:
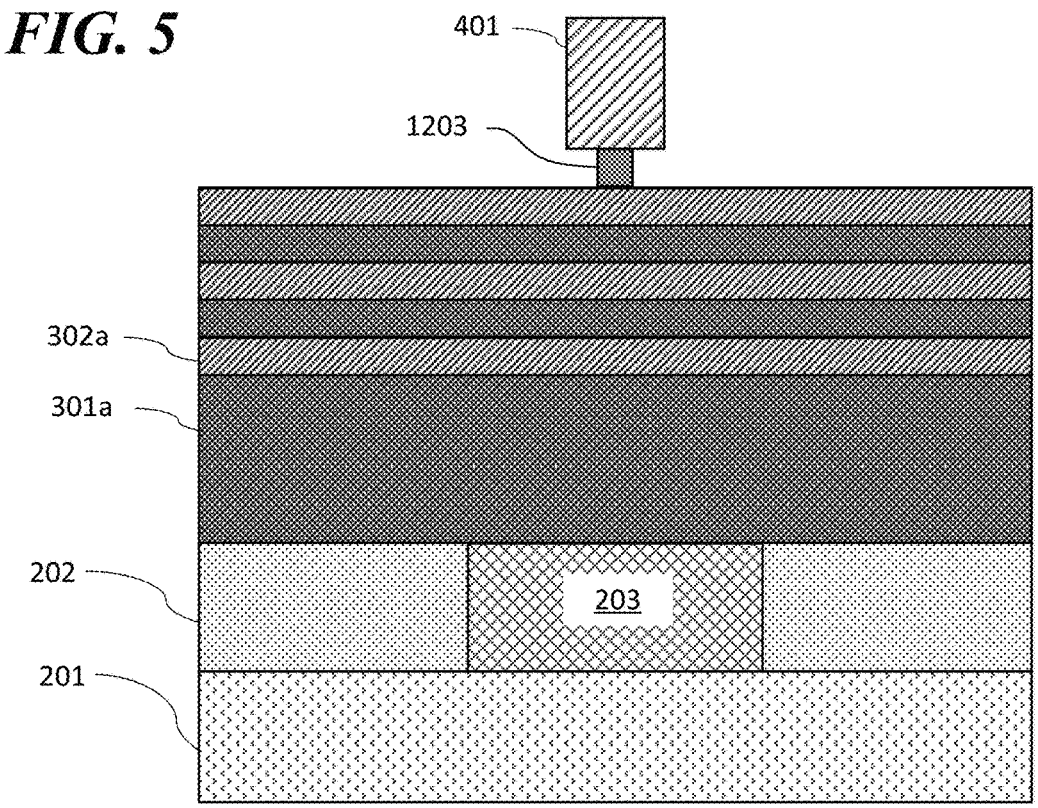

According to some embodiments and referring to FIG. 5, an isotropic (lateral) etch of the topmost metal layer is performed, removing end portions of the topmost metal layer and forming the metal nano pillar 1203 under hardmask pillar 401. According to some embodiments, the isotropic etch process can be selective to TaN or TiN.

According to example embodiments a dimension of the metal nano pillar 1203 can be less than a dimension that can be formed by lithography, resulting in a small contact area with a top phase change material and reducing a total heat required for phase changes, which in turn can reduce a current required for each SET or RESET operations.

Figure 6:
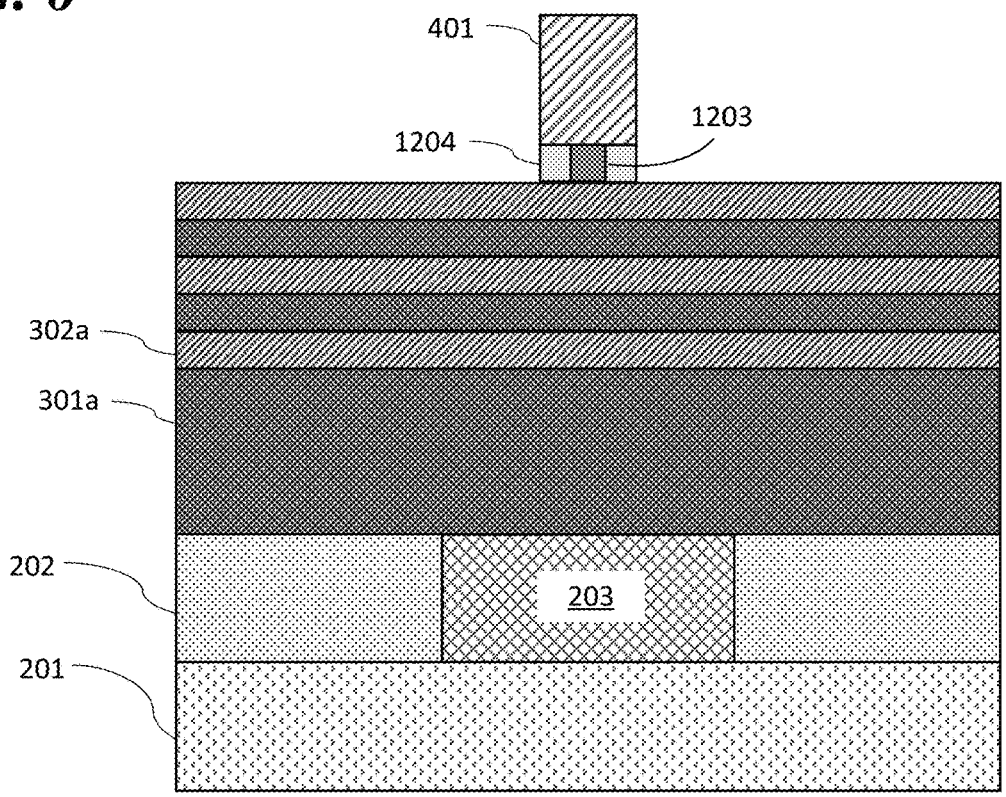

According to some embodiments and referring to FIG. 6, a dielectric liner (not shown) is deposited and etched back, using the hardmask pillar 401 as a mask, to form the inner spacer 1204 around the metal nano pillar 1203. The inner spacer 1204 may be formed of materials including, but not limited to, silicon nitride (SixNy), silicon oxynitride (SiON), and/or silicon carbonide nitride (SiCN), and/or oxide materials such as silicon oxide (SiOx)

Figure 7:
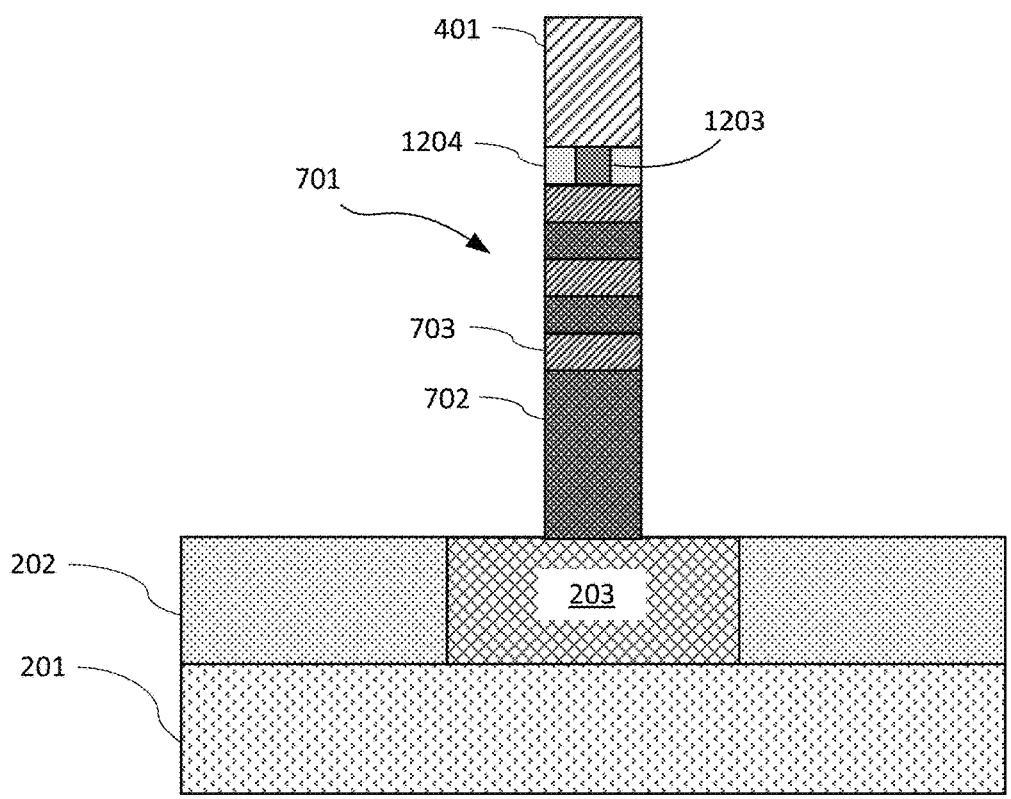

According to some embodiments and referring to FIG. 7, a directional RIE of the multilayer stack is performed, which stops on the bottom electrode 203 and forms a patterned multilayer stack 701 including patterned layers of TiN, e.g., 702, and TaN, e.g., 703.

Figure 8:
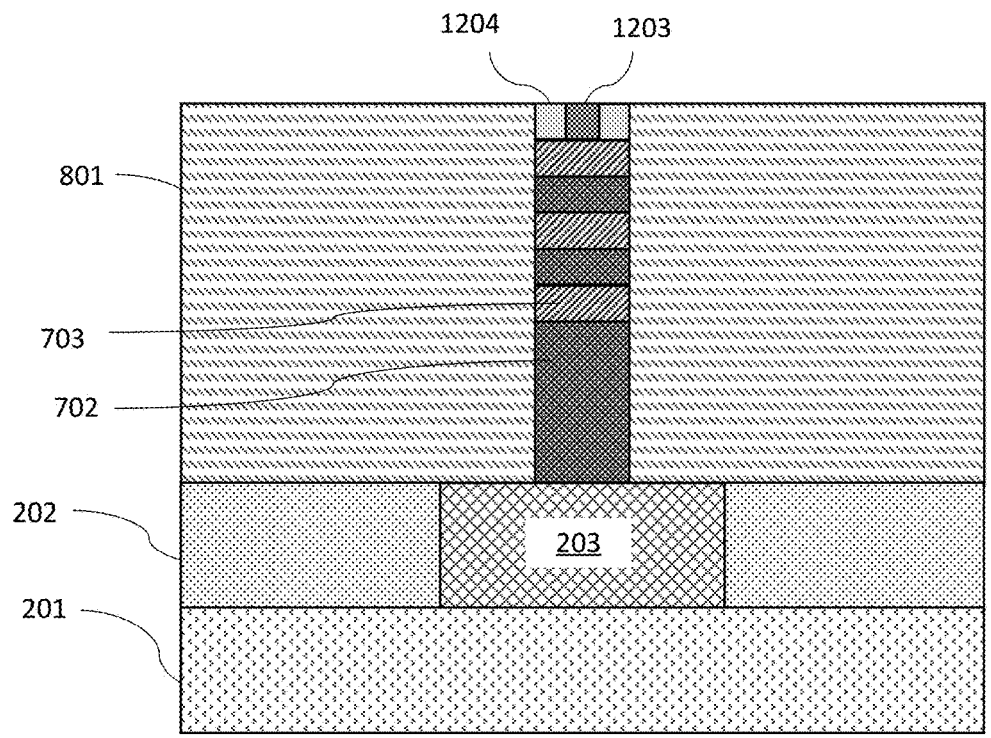

According to some embodiments and referring to FIG. 8, a dielectric layer 801 (e.g., oxide) is deposited, and a chemical mechanic polish (CMP) is performed, which stops on a top of the metal nano pillar 1203.

Figure 9:
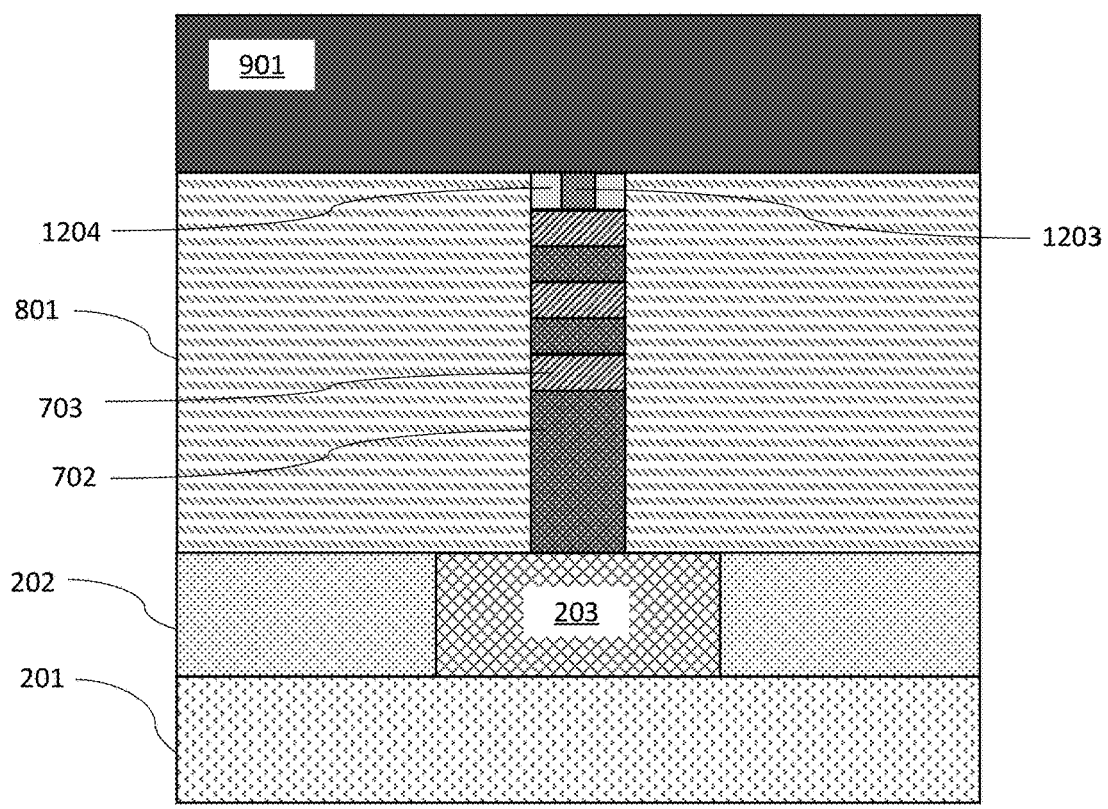

According to some embodiments and referring to FIG. 9, a PCM 901, such as $Ge_2Se_2Te_5$ (GST), is deposited on the dielectric layer 801. The PCM 901 may be formed of, for example, a Ge—Sb—Te (germanium-antimony-tellurium or "GST", such as $Ge_2Sb_2Te_5$) alloy. Other suitable materials for the PCM 901 include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the PCM 901 can further include nitrogen, carbon, and/or oxygen. In some embodiments, the PCM 901 can be doped with dielectric materials including, but not limited to, aluminum oxide ($Al_2O_3$), silicon oxide ($SiO_2$), (Tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc.

Figure 10:
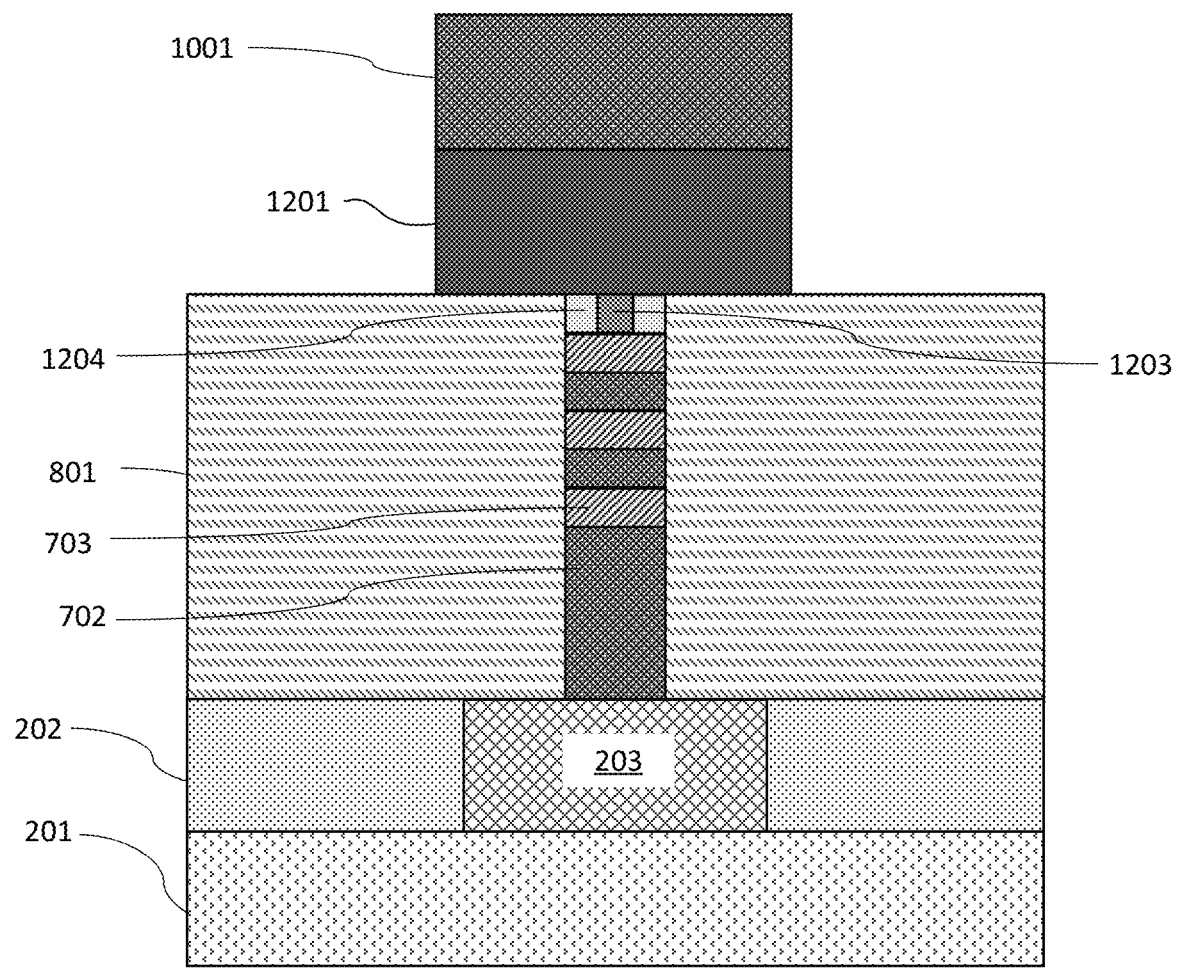

According to some embodiments and referring to FIG. 10, a top hardmask 1001, formed of, for example, TiN, is formed and used to pattern the PCM 901, forming the mushroom PCM element 1201.

Figure 11:
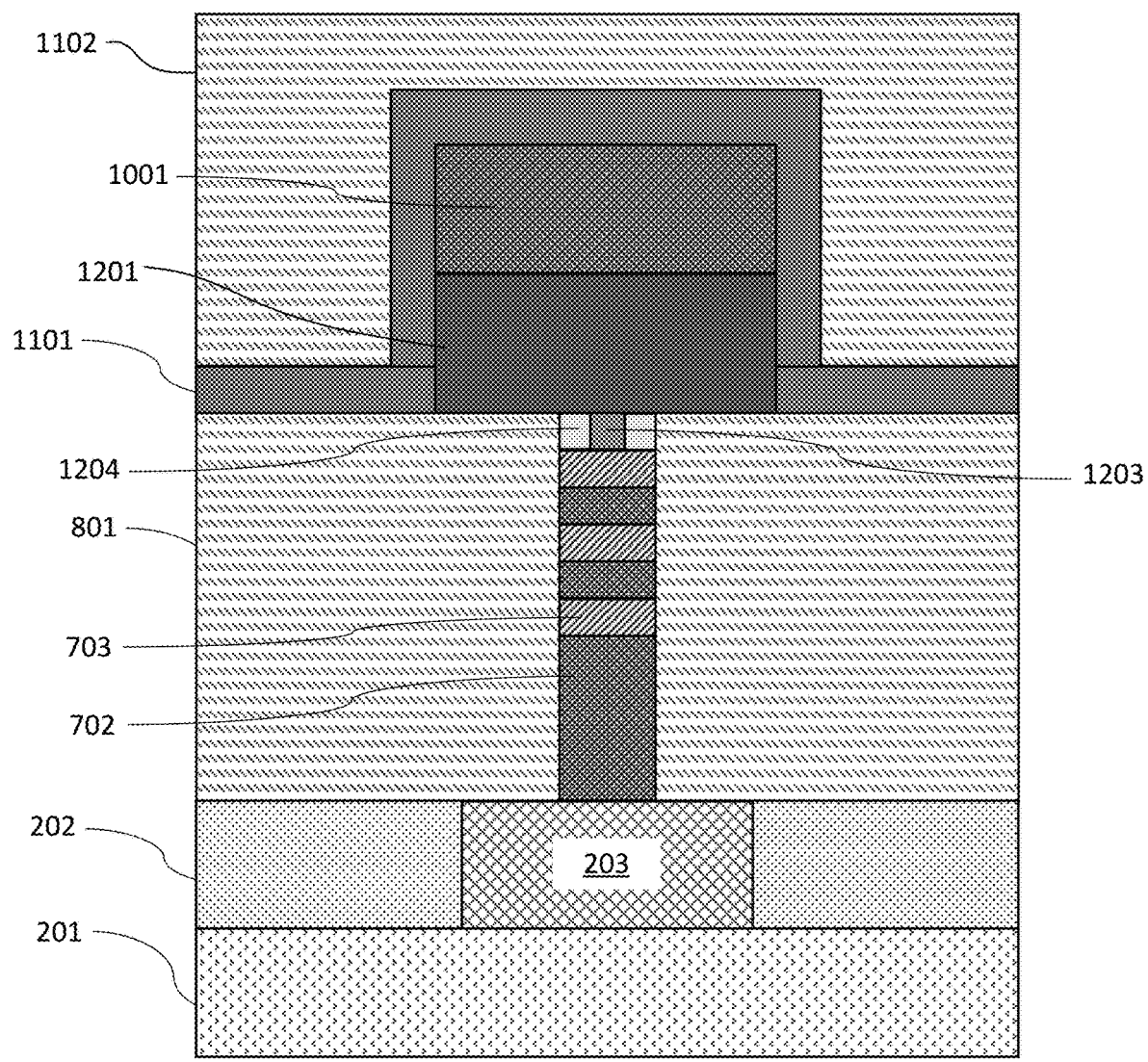

According to some embodiments and referring to FIG. 11, an encapsulation layer 1101, such as SiN, is deposited, a second dielectric layer 1102 is deposited, and a CMP is performed to planarize the second dielectric layer.

According to some embodiments and referring to FIG. 12, a via is formed in the encapsulation layer 1101 and the second dielectric layer 1102, exposing a top surface of the top hardmask 1001, and a metallization is performed to form the top electrode 1202 and a top electrode contact 1205. The dimension of the metal nano pillar 1203 can be less than a lithography limit, resulting in a small contact area with the mushroom PCM element 1201, reducing a programming current.

Referring to FIG. 12, according to some aspects, the PCM cell 1200 includes the mushroom PCM element 1201 connected to the top electrode 1202 and the metal nano pillar 1203 with a small dimension (e.g., less than a lithography limit). The small contact area of the metal nano pillar with the mushroom PCM element 1201 reduces a total heat needed for a phase change, which in turn reduces a current needed for each SET or RESET operation. According to some aspects, the inner spacer 1204 surrounding the metal nano pillar can act as a thermal insulation layer to prevent the migration of heat away from a contact region to surrounding material.

Figure 13:
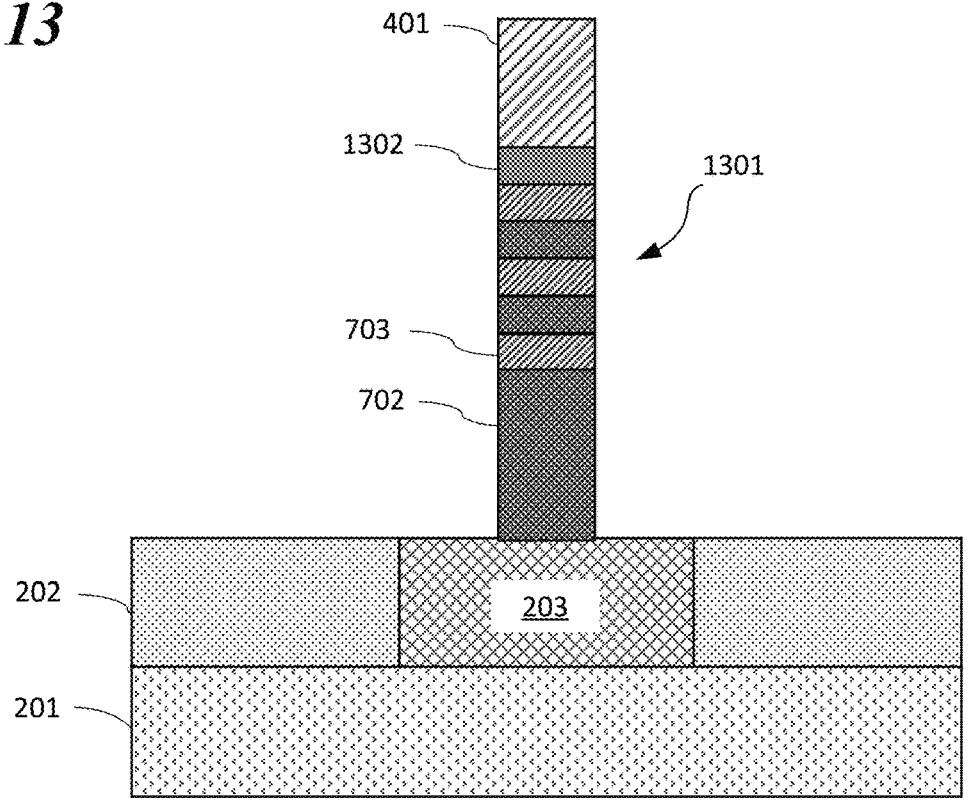
FIGS. 13-14 are cross-section views of a PCM at different steps in a direction etch process according to one or more embodiments of the present invention.
Figure 14:
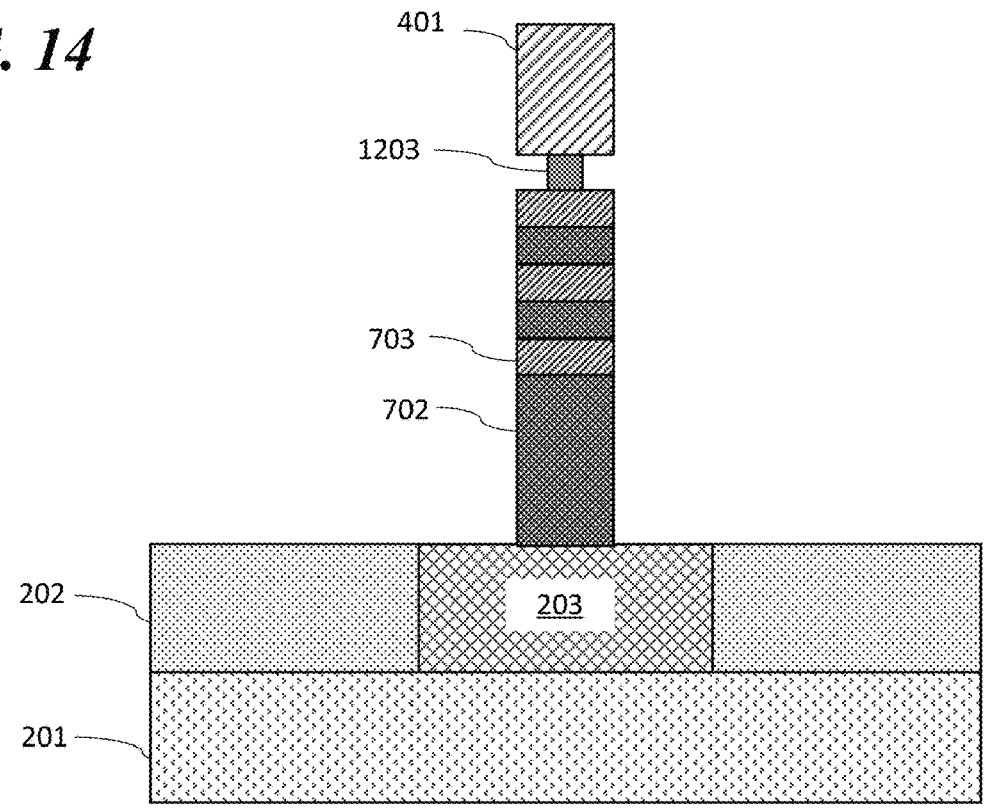

FIGS. 13-14 are cross-section views of a PCM cell at different steps in a direction etch process according to one or more embodiments of the present invention.

According to some embodiments and referring to FIG. 13, a directional RIE of the multilayer stack can be performed following the formation of the hardmask pillar 401 at step 105. The directional RIE of the multilayer stack stops on the bottom electrode 203 and forms a patterned multilayer stack 1301 including patterned layers of TiN, e.g., 702, and TaN, e.g., 703, and a patterned topmost metal layer 1302.

According to some embodiments and referring to FIG. 14, and at step 106, an isotropic (lateral) etch of the patterned topmost metal layer 1302 is performed, removing end portions of the patterned topmost metal layer and forming the metal nano pillar under the hardmask pillar. According to some embodiments, the isotropic etch process can be selective to TaN, TiN, and the material forming the metal nano pillar. Following the isotropic etch at step 106, a dielectric liner (not shown) is deposited and etched back to form an inner spacer (see for example, FIG. 7, inner spacer 1204) around the metal nano pillar 1203. The method can advance to step 109, depositing the dielectric layer, and a chemical mechanic polish (CMP) is performed, which removes the hardmask pillar 401 and stops on a top of the metal nano pillar 1203.

FIG. 15 is a view of a PCM cell 1501 according to one or more embodiments of the present invention. A first lateral dimension d0 of the metal nano pillar 1203 is smaller than that of conventional lithographic capabilities. The lateral dimension d0 is associated with a reduced programming current. The inner spacer 1204 surrounding the metal nano pillar 1203 can act as thermal insulation layer to reduce or prevent the lateral heat loss.

According to some embodiments, the alternating electrical conductor layers (e.g., the patterned layers of TiN, e.g., 702, and TaN, e.g., 703) having a second lateral dimension d1 below the metal nano pillar 1203 further reduces heat loss downwards.

According to some embodiments, the metal nano pillar 1203 reducing a programming current, the inner spacer 1204 reducing lateral heat loss, and the alternating electrical conductor layers (e.g., the patterned layers of TiN, e.g., 702, and TaN, e.g., 703) reducing downwards heat loss, improve an overall efficiency of the PCM cell 1501.

Recapitulation:

According to embodiments of the present invention, a phase-change memory device includes a bottom electrode 203; a stack 701 of alternating electrical conductor layers directly contacting a top surface of the bottom electrode; a metal pillar 1203 directly contacting a top surface of the stack; a phase change material element 1201 directly contacting a top surface of the metal pillar; and a top electrode 1202 on the phase change material element, wherein a lateral dimension of the metal pillar is smaller than that of the stack.

According to some embodiments, a method 100 for manufacturing a crossbar phase-change memory cell includes: providing a bottom electrode disposed an underlayer at step 101; forming a multilayer stack at step 103 comprising a plurality of alternating electrical conductor layers; depositing a topmost metal layer at step 104 on the multilayer stack, which is formed of a material different than those of the multilayer stack; forming a hardmask pillar at step 105 on the topmost metal layer; etching the topmost metal layer to form a metal pillar at step 106; forming an inner spacer at step 107 surrounding the metal pillar; patterning the multilayer stack at step 108 using the hardmask pillar; forming a dielectric layer at step 109 having a height equal to a top surface of the metal pillar; removing the hardmask pillar, also at step 109; and forming a phase change material element at step 111 on the metal pillar.

According to some embodiments, forming the phase change material element comprises: depositing a phase change material at step 110; forming a top hardmask at step 111 on the phase change material; and patterning a phase change material using the top hardmask at step 111 to form the phase change material element.

According to some embodiments, the method includes depositing an encapsulation layer at step 112 over the phase change material element; depositing a second dielectric layer at step 112 on the encapsulation layer; forming a via in the encapsulation layer and the second dielectric layer exposing the top hardmask at step 113; and performing a metallization forming a top electrode and a top electrode contact contacting the top hardmask at step 113.

According to some embodiments, forming the inner spacer at step 107 includes: depositing a dielectric liner on the multilayer stack; and etching the dielectric liner back to a width of the hardmask pillar.

According to some embodiments, the patterning of the multilayer stack at step 108 using the hardmask pillar is preformed prior to etching the topmost metal layer to form the metal pillar at step 106 and forming of the inner spacer at step 107.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase-change memory device comprising:
a bottom electrode;
a stack of alternating electrical conductor layers stacked parallel to the bottom electrode and directly contacting a top surface of the bottom electrode, wherein the stack of alternating electrical conductor layers in turn comprises:
  at least two titanium nitride (TiN) layers including a bottommost titanium nitride (TiN) layer; and
  at least two tantalum nitride (TaN) layers including a topmost tantalum nitride (TaN) layer;
a metal pillar directly contacting a top surface of the topmost tantalum nitride (TaN) layer;
a phase change material element directly contacting a top surface of the metal pillar;
a thermally and electrically insulating spacer on the stack and surrounding the metal pillar under the phase change material element; and
a top electrode on the phase change material element,
wherein a lateral dimension of the metal pillar is smaller than that of the stack.

2. The phase-change memory device of claim 1, further comprising:
  an underlayer under the bottom electrode; and
  an interlevel dielectric on the underlayer and surrounding the bottom electrode.

3. The phase-change memory device of claim 1, wherein the thermally and electrically insulating spacer has a width equal to a width of the stack.

4. The phase-change memory device of claim 1, further comprising:
  a first dielectric layer surrounding the stack;
  an encapsulation layer formed over the phase change material and the first dielectric layer; and
  a second dielectric layer formed on the encapsulation layer, wherein the top electrode is formed on the second dielectric layer, and the top electrode further comprising a top electrode contact electrically connecting the top electrode to the phase change material element.

5. The phase-change memory device of claim 4, further comprising a top hardmask between the phase change material element and the top electrode contact.

6. The phase-change memory device of claim 4, wherein the top electrode contact extends through the encapsulation layer.

7. The phase-change memory device of claim 1, further comprising a top hardmask on the phase change material element having a same width as the phase change material element.

8. The phase-change memory device of claim 1, wherein a thickness of the bottommost TiN layer is equal to a thickness of the topmost TaN layer.

9. The phase-change memory device of claim 1, wherein a thickness of the bottommost TiN layer is greater than a thickness of any other layer of the stack.

10. The phase-change memory device of claim 1, wherein the metal pillar is formed of a material other than TiN and TaN.

11. The phase-change memory device of claim 1, wherein the metal pillar is formed of a material different than those of the stack of alternating electrical conductor layers.

12. The phase-change memory device of claim 1, wherein the metal pillar is a heater.

13. The phase-change memory device of claim 1, wherein the metal pillar is a heater configured to heat the phase change material element.

* * * * *